United States Patent
Karri et al.

(10) Patent No.: US 11,928,641 B2
(45) Date of Patent: Mar. 12, 2024

(54) SELF ADAPTIVE DELIVERY BASED ON SIMULATED DISRUPTION

(71) Applicant: International Business Machines Corporation, Armonk, NY (US)

(72) Inventors: Venkata Vara Prasad Karri, Visakhapatnam (IN); Sarbajit K. Rakshit, Kolkata (IN)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/037,925

(22) Filed: Sep. 30, 2020

(65) Prior Publication Data
US 2022/0101260 A1   Mar. 31, 2022

(51) Int. Cl.
*G06Q 10/0835* (2023.01)
*G06F 30/20* (2020.01)
*G06Q 10/083* (2023.01)

(52) U.S. Cl.
CPC ....... *G06Q 10/08355* (2013.01); *G06F 30/20* (2020.01); *G06Q 10/0838* (2013.01)

(58) Field of Classification Search
USPC ........................................................ 705/338
See application file for complete search history.

(56) References Cited

U.S. PATENT DOCUMENTS

| | | | | |
|---|---|---|---|---|
| 5,995,084 A | * | 11/1999 | Chan | G06F 3/03547 345/173 |
| 7,737,857 B2 | | 6/2010 | Ebert | |
| 10,156,448 B2 | | 12/2018 | Geelen | |
| 2002/0147654 A1 | * | 10/2002 | Kraisser | G06Q 10/0631 705/330 |
| 2003/0014286 A1 | * | 1/2003 | Cappellini | G06Q 10/047 705/5 |
| 2007/0239348 A1 | * | 10/2007 | Cheung | G01C 21/343 701/467 |

(Continued)

FOREIGN PATENT DOCUMENTS

JP       2007058345 A   *   3/2007

OTHER PUBLICATIONS

How does Waze work?, Google, https://support.google.com/waze/answer/6078702?hl=en, Nov. 19, 2019 (Accessed Nov. 20, 2021) (Year: 2019).*

(Continued)

*Primary Examiner* — Zeina Elchanti
(74) *Attorney, Agent, or Firm* — Michael A. Petrocelli

(57) ABSTRACT

Revising a delivery route for a user based on, at least, identified disruptions is provided. A computer device identifies delivery parameters for a delivery, wherein the delivery parameters include (i) a delivery route from a shipping location to a delivery location, and (ii) one or more delivery constraints. The computing device displays the delivery route on a graphical user interface (GUI), wherein the GUI is configured to be interacted with by one or more users. The computing devices receives from a user via the GUI, a definition of an environmental disruption. The computing device generates a revised delivery route, wherein the revised delivery route modifies the delivery route to avoid the environmental disruption while satisfying the one or more delivery constraints. The computing device displays the revised delivery route on the GUI.

20 Claims, 6 Drawing Sheets

(56) References Cited

U.S. PATENT DOCUMENTS

| | | | | |
|---|---|---|---|---|
| 2008/0046274 | A1* | 2/2008 | Geelen | G01C 21/26 |
| | | | | 717/176 |
| 2008/0275643 | A1* | 11/2008 | Yaqub | G01C 21/343 |
| | | | | 701/412 |
| 2013/0077478 | A1* | 3/2013 | Matsuura | H04L 12/6418 |
| | | | | 370/225 |
| 2014/0067564 | A1* | 3/2014 | Yuan | G06Q 30/0641 |
| | | | | 705/16 |
| 2016/0258775 | A1* | 9/2016 | Santilli | G01C 21/3614 |
| 2017/0285656 | A1* | 10/2017 | Kohlenberg | G05D 1/0276 |
| 2018/0172459 | A1* | 6/2018 | Mazzella | G01C 21/3415 |
| 2018/0350021 | A1* | 12/2018 | Pedawi | G06F 16/29 |
| 2020/0133268 | A1* | 4/2020 | Walsh | B62D 15/0285 |
| 2020/0302376 | A1* | 9/2020 | Putcha | G06Q 30/0202 |
| 2021/0034847 | A1* | 2/2021 | Lacaze | G06K 9/00362 |

OTHER PUBLICATIONS

Joshua Brustein, Waze's Maps Now Change as Roads Close, The New York Times: Business, Innovation, Technology, Society, (Feb. 27, 2013) (accessed May 17, 2022). (Year: 2013).*

Route4me, Route4Me Automated Route Simulations, Aug. 12, 2020, https://web.archive.org/web/20200812095232/https://support.route4me.com/automated-route-simulations/ (accessed Nov. 4, 2022). (Year: 2020).*

"Package Delivery Route Optimization with Tight Travel Time" Published by ACM digital library (Year: 2019).*

Morgan, Blake, "5 Examples of how AI can be used across the supply chain", Sep. 17, 2018, 4 pages, <https://www.forbes.com/sites/blakemorgan/2018/09/17/5-examples-of-how-ai-can-be-used-across-the-supply-chain/#6931ad83342e>.

Elliott, Cindy, "A Digital Twin for the Supply Chain", Operational Intelligence, Oct. 11, 2017, 15 pages.

Ivanov et al., "Digital Supply Chain Twins: Managing the Ripple Effect, Resilience, and Disruption Risks by Data-Driven Optimization, Simulation, and Visibility", ResearchGate, Jan. 2019, DOI: 10.1007/978-3-030-14302-2_15, 22 pages.

"Methodologies to Estimate the Economic Impacts of Disruptions to the Goods Movement System", NCHRP Report 732, © 2012 National Academy of Sciences, 105 pages.

Cruz-Mejia et al., "Product Delivery and Simulation for Industry 4.0", ResearchGate, May 2019, DOI: 10.1007/978-3-030-04137-3_5, 41 pages.

Shaw, Scott, "Using a Supply Chain Digital Twin to Improve Logistics", Date: Sep. 24, 2019, 8 pages.

Mell et al., "The NIST Definition of Cloud Computing", Recommendations of the National Institute of Standards and Technology, NIST Special Publication 800-145, Sep. 2011, 7 pages.

* cited by examiner

SELF ADAPTIVE DELIVERY BASED ON SIMULATED DISRUPTION

BACKGROUND OF THE INVENTION

The present invention relates generally to the field of digital navigation, and more particularly to adaption to simulated disruptions.

In the field of product delivery, digital navigation may be used to determine a transportation route and generate turn by turn directions that guide a delivery vehicle to its destination. The digital navigation generally identifies roadways and plots a transportation route based on which roadways lead towards the destination.

SUMMARY

Embodiments of the present invention provide a method, system, and program product for revising a delivery route for a user based on, at least, an identified disruption.

A first embodiment encompasses a method for revising a delivery route for a user based on, at least, an identified disruption. One or more processors identify delivery parameters for a delivery, wherein the delivery parameters include (i) a delivery route from a shipping location to a delivery location, and (ii) one or more delivery constraints. The one or more processors display the delivery route on a graphical user interface (GUI), wherein the GUI is configured to be interacted with by one or more users. The one or more processors receive from a user via the GUI, a definition of an environmental disruption. The one or more processors generate a revised delivery route, wherein the revised delivery route modifies the delivery route to avoid the environmental disruption while satisfying the one or more delivery constraints. The one or more processors display the revised delivery route on the GUI.

A second embodiment encompasses a computer program product for revising a delivery route for a user based on, at least, an identified disruption. The computer program product includes one or more computer-readable storage media and program instructions stored on the one or more computer-readable storage media. The program instructions include program instructions to identify delivery parameters for a delivery, wherein the delivery parameters include (i) a delivery route from a shipping location to a delivery location, and (ii) one or more delivery constraints. The program instructions include program instructions to display the delivery route on a graphical user interface (GUI), wherein the GUI is configured to be interacted with by one or more users. The program instructions include program instructions to receive from a user via the GUI, a definition of an environmental disruption. The program instructions include program instructions to generate a revised delivery route, wherein the revised delivery route modifies the delivery route to avoid the environmental disruption while satisfying the one or more delivery constraints. The program instructions include program instructions to display the revised delivery route on the GUI.

A third embodiment encompasses a computer system for revising a delivery route for a user based on, at least, an identified disruption. The computer system includes one or more computer processors, one or more computer-readable storage media, and program instructions stored on the computer-readable storage media for execution by at least one of the one or more processors. The program instructions include program instructions to identify delivery parameters for a delivery, wherein the delivery parameters include (i) a delivery route from a shipping location to a delivery location, and (ii) one or more delivery constraints. The program instructions include program instructions to display the delivery route on a graphical user interface (GUI), wherein the GUI is configured to be interacted with by one or more users. The program instructions include program instructions to receive from a user via the GUI, a definition of an environmental disruption. The program instructions include program instructions to generate a revised delivery route, wherein the revised delivery route modifies the delivery route to avoid the environmental disruption while satisfying the one or more delivery constraints. The program instructions include program instructions to display the revised delivery route on the GUI.

DETAILED DESCRIPTION

Figure 1:
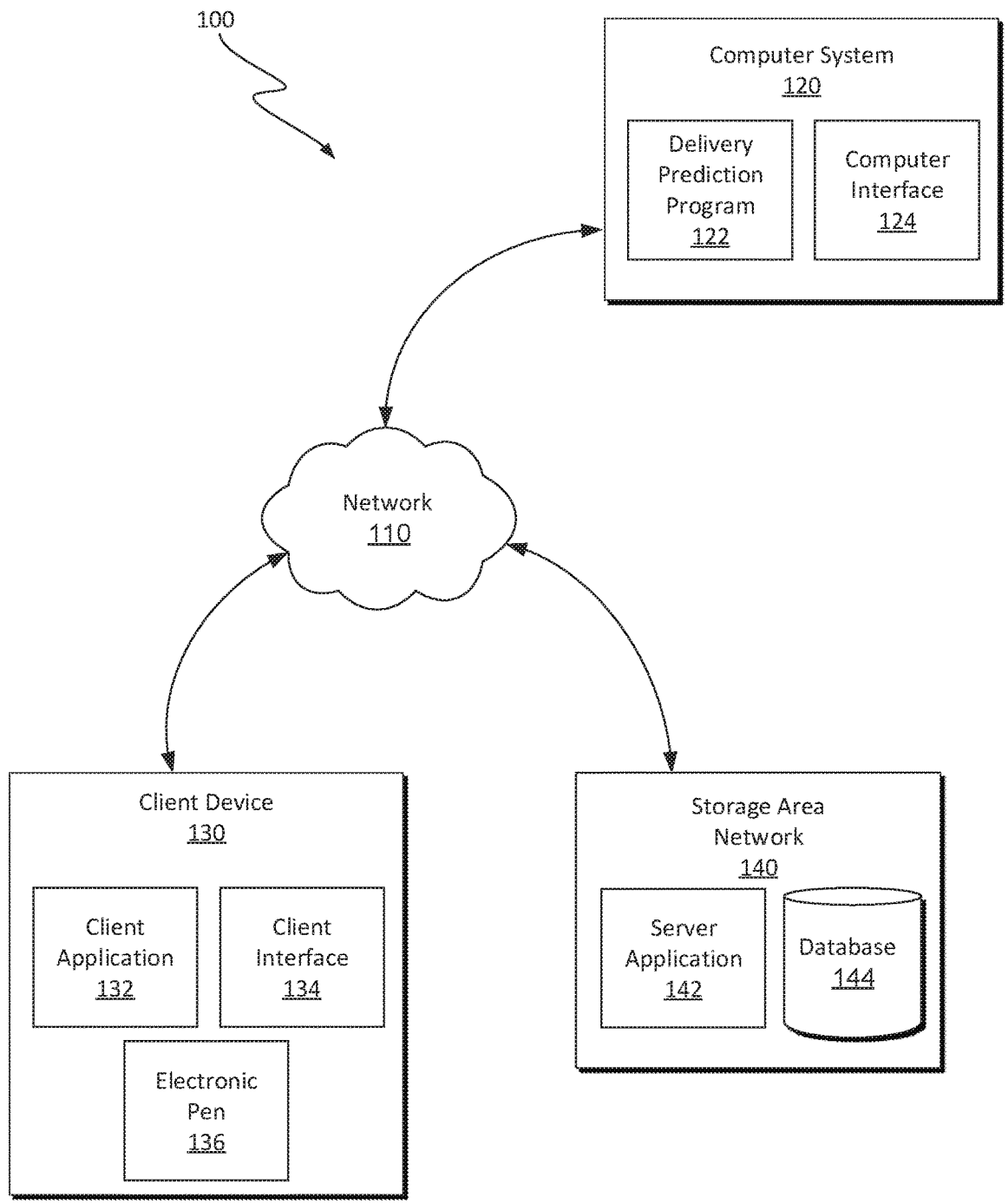
FIG. 1 is a functional block diagram illustrating a computing environment, in which a computing device generates a delivery route for a user based on, at least, identified disruptions, in accordance with an exemplary embodiment of the present invention.

Detailed embodiments of the present invention are disclosed herein with reference to the accompanying drawings. It is to be understood that the disclosed embodiments are merely illustrative of potential embodiments of the present invention and may take various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

While existing digital navigation solutions are known, these solutions may be inadequate in providing navigation that compensates for (i) environmental disruptions, (ii) shipping timelines, and (iii) costs associated with the shipping of products. For example, existing solutions often incorporate general navigation tools that route a user through roadways and interstates without regard to environmental disruptions that could obstruct the driving route and impair the timeliness of a delivery, and do not allow users to define potential disruptions while planning a delivery route. In contrast, various embodiments of the present invention allow a user to define a shipping location, a delivery location, and a geographic region in which a delivery route is to occur, along with any possible environmental disruptions that would obstruct the delivery route. Various embodiments of the present invention further include such definitions in the determination of the delivery route. Such an approach yields a more accurate delivery route by including parameters that the system may not be aware of In various embodiments, user input is also combined with data from a corpus of knowledge to generate a complete delivery route that avoids environmental disruptions within a specified timeline and within a cost efficient budget.

Embodiments of the present invention provide a technological improvement over known solutions for digital navigation. Embodiments of the present invention provide servers and systems that improve over conventional systems by providing for more efficient digital navigation, thereby decreasing user time on the system, and ultimately reducing the overall system load. Embodiments of the present invention recognize that the systems would see a decrease in load because users are provided with a more accurate digital navigation that would aide in the delivery route for products, for example. Embodiments of the present invention further recognize that the incorporation of user defined environmental disruptions and additional resources allows for the system to predict delivery routes that meet delivery timelines and budget parameters, thus reducing the amount of time users spends on the system which again, reduces overall system load.

The present invention will now be described in detail with reference to the Figures.

FIG. 1 is a functional block diagram illustrating a computing environment, generally designated 100, in accordance with one embodiment of the present invention. Computing environment 100 includes computer system 120, client device 130 and storage area network 140 connected over network 110. Computer system 120 includes delivery prediction program 122 and computer interface 124. Client device 130 includes client application 132, client application 134, and electronic pen 136. Storage area network (SAN) 140 includes server application 142 and database 144.

In various embodiment of the present invention, computer system 120 is a computing device that can be a standalone device, a server, a laptop computer, a tablet computer, a netbook computer, a personal computer (PC), a personal digital assistant (PDA), a desktop computer, or any programmable electronic device capable of receiving, sending, and processing data. In general, computer system 120 represents any programmable electronic device or combination of programmable electronic devices capable of executing machine readable program instructions and communications with various other computer systems (not shown). In another embodiment, computer system 120 represents a computing system utilizing clustered computers and components to act as a single pool of seamless resources. In general, computer system 120 can be any computing device or a combination of devices with access to various other computing systems (not shown) and is capable of executing delivery prediction program 122 and computer interface 124. Computer system 120 may include internal and external hardware components, as described in further detail with respect to FIG. 6.

In this exemplary embodiment, delivery prediction program 122 and computer interface 124 are stored on computer system 120. However, in other embodiments, delivery prediction program 122 and computer interface 124 are stored externally and accessed through a communication network, such as network 110. Network 110 can be, for example, a local area network (LAN), a wide area network (WAN) such as the Internet, or a combination of the two, and may include wired, wireless, fiber optic or any other connection known in the art. In general, network 110 can be any combination of connections and protocols that will support communications between computer system 120, client device 130, and SAN 140, and various other computer systems (not shown), in accordance with desired embodiment of the present invention.

In the embodiment depicted in FIG. 1, delivery prediction program 122, at least in part, has access to client application 132 and can communicate data stored on computer system 120 to client device 130, SAN 140, and various other computer systems (not shown). More specifically, delivery prediction program 122 defines a user of computer system 120 that has access to data stored on client device 130 and/or database 144.

Delivery prediction program 122 is depicted in FIG. 1 for illustrative simplicity. In various embodiments of the present invention, delivery prediction program 122 represents logical operations executing on computer system 120, where computer interface 124 manages the ability to view these logical operations that are managed and executed in accordance with delivery prediction program 122. In some embodiments, delivery prediction program 122 represents a prediction model that processes and analyzes input and output (I/O). Additionally, delivery prediction program 122, when executing prediction model processing, operates to learn from the I/O that was analyzed and generates a delivery route based on, at least, defined disruptions within the geographic region of the delivery location and shipping location. Embodiments of the geographic region represent a boundary for the delivery route that includes, but not limited to, the delivery route, shipping and delivery locations, roadways, interstates, landmarks, geographic features (e.g., mountains, rivers, lakes, etc.).

Computer system 120 includes computer interface 124. Computer interface 124 provides an interface between computer system 120, client device 130, and SAN 140. In some embodiments, computer interface 124 can be a graphical user interface (GUI) or a web user interface (WUI) and can display, text, documents, web browsers, windows, user options, application interfaces, and instructions for operation, and includes the information (such as graphic, text, and sound) that a program presents to a user and the control sequences the user employs to control the program. In some embodiments, computer system 120 accesses data communicated from client device 130 and/or SAN 140 via a client-based application that runs on computer system 120. For example, computer system 120 includes mobile application software that provides an interface between computer system 120, client device 130, and SAN 140. In various embodiments, computer system 120 communicates the GUI or WUI to client device 130 for instruction and use by a user of client device 130.

In various embodiments, client device 130 is a computing device that can be a standalone device, a server, a laptop computer, a tablet computer, a netbook computer, a personal computer (PC), a personal digital assistant (PDA), a desktop computer, or any programmable electronic device capable of receiving, sending and processing data. In general, computer system 120 represents any programmable electronic device or combination of programmable electronic devices capable of executing machine readable program instructions and communications with various other computer systems (not shown). In another embodiment, computer system 120 represents a computing system utilizing clustered computers and components to act as a single pool of seamless resources. In general, computer system 120 can be any computing device or a combination of devices with access to various other computing systems (not shown) and is capable of executing client application 132, client interface 134, and electronic pen 136. Client device 130 may include internal and external hardware components, as described in further detail with respect to FIG. 6.

Client application 132 is depicted in FIG. 1 for illustrative simplicity. In various embodiments of the present invention client application 132 represents logical operations executing on client device 130, where client interface 134 manages the ability to view these various embodiments, and client application 132 defines a user of client device 130 that has access to data stored on computer system 120 and/or database 144. In various embodiments, client application 132 receives data from electronic pen 136, where electronic pen 136 is an input device that captures handwriting, brush strokes, and user movements electronically and converts the analog hand motions into digital data received by client application 132. Embodiments of the present invention provide that a user of client device 130 uses electronic pen 136 to define a geographic region for the delivery route that includes a delivery location and a shipping location, where the delivery location is the end point and the shipping location is the starting point of a delivery route.

Storage area network (SAN) 140 is a storage system that includes server application 142 and database 144. SAN 140 may include one or more, but is not limited to, computing devices, servers, server-clusters, web-servers, databases and storage devices. SAN 140 operates to communicate with computer system 120, client device 130, and various other computing devices (not shown) over a network, such as network 110. For example, SAN 140 communicates with delivery prediction program 122 to transfer data between computer system 120, client device 130, and various other computing devices (not shown) that are not connected to network 110. SAN 140 can be any computing device or a combination of devices that are communicatively connected to a local IoT network, i.e., a network comprised of various computing devices including, but are not limited to computer system 120 and client device 130, to provide the functionality described herein. SAN 140 can include internal and external hardware components as described with respect to FIG. 6. Embodiments of the present invention recognize that FIG. 1 may include any number of computing devices, servers, databases, and/or storage devices, and the present invention is not limited to only what is depicted in FIG. 1. As such, in some embodiments some of the features of computer system 120 are included as part of SAN 140 and/or another computing device.

Additionally, in some embodiments, SAN 140 and computer system 120 represent, or are part of, a cloud computing platform. Cloud computing is a model or service delivery for enabling convenient, on demand network access to a shared pool of configurable computing resources (e.g., networks, network bandwidth, servers, processing, memory, storage, applications, virtual machines, and service(s) that can be rapidly provisioned and released with minimal management effort or interaction with a provider of a service. A cloud model may include characteristics such as on-demand self-service, broad network access, resource pooling, rapid elasticity, and measured service, can be represented by service models including a platform as a service (PaaS) model, an infrastructure as a service (IaaS) model, and a software as a service (SaaS) model, and can be implemented as various deployment models as a private cloud, a community cloud, a public cloud, and a hybrid cloud. In various embodiments, SAN 140 represents a database or website that includes, but is not limited to, data associated with environmental disruptions to delivery service.

SAN 140 and computer system 120 are depicted in FIG. 1 for illustrative simplicity. However, it is to be understood that, in various embodiments, SAN 140 and computer system 120 can include any number of databases that are managed in accordance with the functionality of delivery prediction program 122 and server application 142. In general, database 144 represents data and server application 142 represent code that provides an ability to use and modify the data. In an alternative embodiment, delivery prediction program 122 can also represent any combination of the aforementioned features, in which server application 142 has access to database 144.

In some embodiments, server application 142 and database 144 are stored on SAN 140. However, in various embodiments, server application 142 and database 144 may be stored externally and accessed through a communication network, such as network 110, as discussed above.

In various embodiments, a user of client device 130 can interact with client device 130 utilizing various implementations that include, but are not limited to, an electronic stylus, a smart pen, the user's fingers (via a touch screen), a keyboard and mouse, and/or other known (or yet to be known) input mechanisms.

In various embodiments of the present invention, a user of client device 130 generates a delivery route request utilizing, at least, electronic pen 136 to define delivery parameters that include, but are not limited to, (i) a geographic region, (ii) one or more environmental disruptions, (iii) a delivery location, and (iv) a shipping location, where client application 132 receives the data from electronic pen 136. In various embodiments, client application 132 detects that a user defines the delivery parameters and a delivery route request is generated. In various embodiments of the present invention, client application 132 communicates the delivery route request to delivery prediction program 122. In various embodiments, a user utilizes electronic pen 136 to define a geographic region that includes, but is not limited to, (i) one or more boundaries, (ii) the delivery location and the shipping location, (iii) one or more roads depicted within a GUI or WUI, and (iv) one or more environmental disruptions that impact delivery service (e.g., flooded areas/roads, heavy traffic, traffic accident, construction, traffic detours, etc.). In various embodiments, a user defines the one or more boundaries by drawing a shape (i.e., a rectangle, circle, irregular shape, etc.), utilizing, at least, electronic pen 136, on a pictographic image representing the geographic region. In various embodiments, the user defines the delivery location and shipping location by placing a pin drop on the address of the location, utilizing electronic pen 136 to tap and drop the pin on the location. In alternative embodiments, the user, utilizing electronic pen 136, can type into a search bar the address of the delivery location and shipping location and communicate this information to delivery prediction program 122. In various embodiments, the user defines the one or more environmental disruptions, utilizing electronic pen 136, by drawing a shape within the boundaries and using, at least, a dropdown menu selects that this shape is designated an environmental disruption that impacts the delivery service.

In various embodiments, delivery prediction program 122 receives the delivery route request from client application 132. Delivery prediction program 122 analyzes the delivery route request and identifies, at least, (i) the delivery location, (ii) the shipping location, (iii) environmental disruptions, and (iv) costs associated with the delivery route. Embodiments of the present invention recognize that the delivery location and shipping location are associated, at least, with physical addresses. Embodiments of the present invention provide that the costs associated with the delivery route are defined by (i) rates from various shipping-based entities within the geographic region and/or (ii) the rates associated with the user (e.g., cost of employing drivers, maintenance of vehicles, cost of gasoline, etc.). Embodiments of the present invention further provide the environmental disruptions are based on, at least, (i) user defined disruptions (e.g., known impacts by the user the would affect the delivery route) and (ii) data regarding disruptions received from various informational entities (e.g., meteorological entities, news-driven entities, governmental entities, etc.). In alternative embodiments, delivery prediction program 122 prompts the user of client device 130 to define the geographic region that includes, at least, (i) the delivery location and (ii) shipping location. In various embodiments, delivery prediction program 122 utilizes the geographic region to determine (i) one or more delivery routes, (ii) resources available to the user, and (iii) a cost-benefit analysis associated with the one or more delivery routes and the resources available to the user.

In various embodiments of the present invention, computer interface 124 represents a GUI or a WUI that is shared with client application 132. In various embodiments, the GUI or WUI includes: (i) a visual depiction of the defined geographic region, (ii) an indication of environmental disruptions that impact the delivery service, and (iii) a cost-benefit analysis of the delivery route and additional resources within the defined geographic region. In various embodiments, a user of client device 130 has access to the GUI or WUI, wherein the user navigates the GUI or WUI and can interact to select (i) delivery routes, (ii) environmental disruptions to delivery service, and (iii) cost-benefit analysis of resources and the delivery route and environmental disruptions.

In various embodiments, client application 132 receives the data of the geographic region and generates a delivery route request and communicates the request to delivery prediction program 122. In various embodiments, delivery prediction program 122 receives the request and utilizes the data contained within the request to generate a delivery route that simulates the impact on the delivery service. In various embodiments, delivery prediction program 122 analyzes (i) current traffic flow, (ii) historical traffic flow, and (iii) the environmental disruptions to define a threshold value of criticality (e.g., heavy traffic, low traffic, etc.) that would impact the delivery service. Embodiments of the present invention provide that delivery prediction program 122 utilizes the data (e.g., environmental disruptions and current and historical traffic flow) to predict the degree of impact (highly impacted, low impact, etc.) on the delivery service.

Additionally, embodiments of the present invention provide that delivery prediction program 122 utilizes the data to identify delivery routes and additional resources that can impact the delivery service, where various delivery routes and/or additional resources can have a positive impact to the delivery service by reducing the time to deliver or reducing the overall cost of the delivery, and what delivery routes and/or additional resources have a negative impacts to the delivery service by increasing the time to deliver or increasing the cost of the delivery.

In various embodiments, delivery prediction program 122 generates a cost-benefit analysis associated with the impact to the delivery service. In various embodiments, delivery prediction program 122 generates one or more delivery routes for delivery service and identifies additional resources (e.g., alternative delivery entities within the area that can reduce the overall cost to the delivery service), where delivery prediction program 122 generates a cost-benefit analysis based on, at least, the generated delivery routes and the additional resources to address the impact the environmental disruptions have on the delivery service. Embodiments of the present invention provide that if a delivery is delayed, then the cost of delivery of the product being delivered is increased and delivery prediction program 122 identifies alternative methods to deliver the product in an appropriate time period.

In various embodiments, delivery prediction program 122 generates a simulation (e.g., delivery route), where the simulation illustrates the impact the environmental disruptions has on the delivery service. Additionally, the simulation (e.g., delivery route) includes, but is not limited to, recommendations for delivery routes with regard to an allocated budget of the delivery service, any alternative delivery routes, and additional resources that can be utilized by the user to deliver the product. In various embodiments, delivery prediction program 122 receives data regarding (i) environmental disruptions (e.g., flooded areas/roads, heavy traffic, traffic accident, construction, traffic detours, etc.) from database 144, and (ii) environmental disruptions from user defined environmental disruptions. In various embodiments, the data stored on database 144 represents a corpus of knowledge from various information entities (e.g., meteorological entities, news-driven entities, governmental entities, etc.) that report and communicate information relating to environmental disruptions that can impact the delivery service. For example, the various information entities can include a news station that is reporting a vehicle accident on a interstate within the boundary of the geographic region, where delivery prediction program 122 identifies the environmental disruption and utilizes this data in determining the delivery route. In various embodiments, delivery prediction program 122 analyzes the environmental disruptions data to generate a delivery route, alternative delivery routes, and additional resources to prevent delay of the delivery service.

In various embodiments, delivery prediction program 122 utilizes historical traffic flow and historical environmental disruption from a corpus of knowledge stored on database 144 to generate the delivery route and, accordingly, update the delivery route based on the historical data. Additionally, in various embodiments, delivery prediction program 122 utilizes the historical data to generate the cost-benefit analysis, where delivery prediction program 122 utilizes the historical data to generate an updated delivery route, alternative delivery route, use additional resource based on, at least, the allocated budget for the delivery service.

Embodiments of the present invention provide for a delivery system that identifies historical traffic information data from a traffic management entity, wherein the data is stored on database 144. In various embodiments, the traffic management entity includes information that includes, but is not limited to, commute times between sections on roadways, traffic accidents, number of vehicles traveling on the roadways, speed of the traffic on roadways, the speed limit of the roadways, availability of parking on various roadways, etc. Additionally, in various embodiments, delivery prediction program 122 receives historical traffic information that represents, at least, various points in time throughout the year and the accompanying weather conditions. In various embodiments, delivery prediction program 122 identifies various roadways within geographic regions, various modes of transportation (e.g., transport truck, small vehicle, aquatic transport, railway, etc.), underground and surface transport, and waterway transport. In various embodiments, delivery prediction program 122 identifies the maps of the roadways within the geographic regions from city planning commissions and online available digital maps, wherein this data is stored on database 144.

Embodiments of the present invention further provide that delivery prediction program 122 receives historical environmental disruption data associated with the geographic regions from database 144. In various embodiments, based on, at least, the historical environmental disruptions, delivery prediction program 122 identifies the impacts the historical environmental disruptions have had on traffic management within the geographic regions. In various embodiments, delivery prediction program 122 represents a prediction model, wherein the prediction model analyzes the corpus of knowledge and identifies (i) a delivery route, (ii) alternative delivery routes, (iii) additional resources, and (iv) a cost-benefit analysis for the delivery system. In various embodiments, the corpus of knowledge analyzed by delivery prediction program 122 will understand the impacts the environmental disruptions and traffic management have on the delivery system of the products by a user of client device 130. In various embodiments, delivery prediction program 122 generates a delivery route (e.g., a GUI or WUI illustrating a digital map with the various roadways of the geographic regions) that plots the path of the delivery and further plots the identified environmental disruptions on the delivery route. In various embodiments, delivery prediction program 122 analyzes the delivery route request and extracts user provided information that relates to geographic regions and various environmental disruptions and plots the data on the delivery route.

Embodiments of the present invention provide that a user of client device 130 can define one or more geographic regions utilizing electronic pen 136. In various embodiments, delivery prediction program 122 defines the criticality of the impact the environmental disruptions will have on the defined geographic regions, where delivery prediction program 122 incorporates the criticality of the impact and the environmental disruptions into the delivery route (e.g., GUI or WUI). In various embodiments, delivery prediction program 122 utilizes the criticality of the impact, the environmental disruptions, and the delivery location and shipping location to generate the delivery route for the shipment of the product. In various embodiments, delivery prediction program 122 generates an alternative delivery route that illustrates various routes the delivery system can take to avoid the environmental disruptions to ensure the delivery of the product within a threshold period of time (e.g., the scheduled delivery time). In various embodiments, delivery prediction program 122 generates a cost-benefit analysis that illustrates the cost to delivery the product to the delivery location from the shipping location based on, at least, the environmental disruptions. In various embodiments, the cost-benefit analysis further represents the cost the environmental disruptions will impact the delivery and include alternative solutions to mitigate excessive costs.

Figure 2:
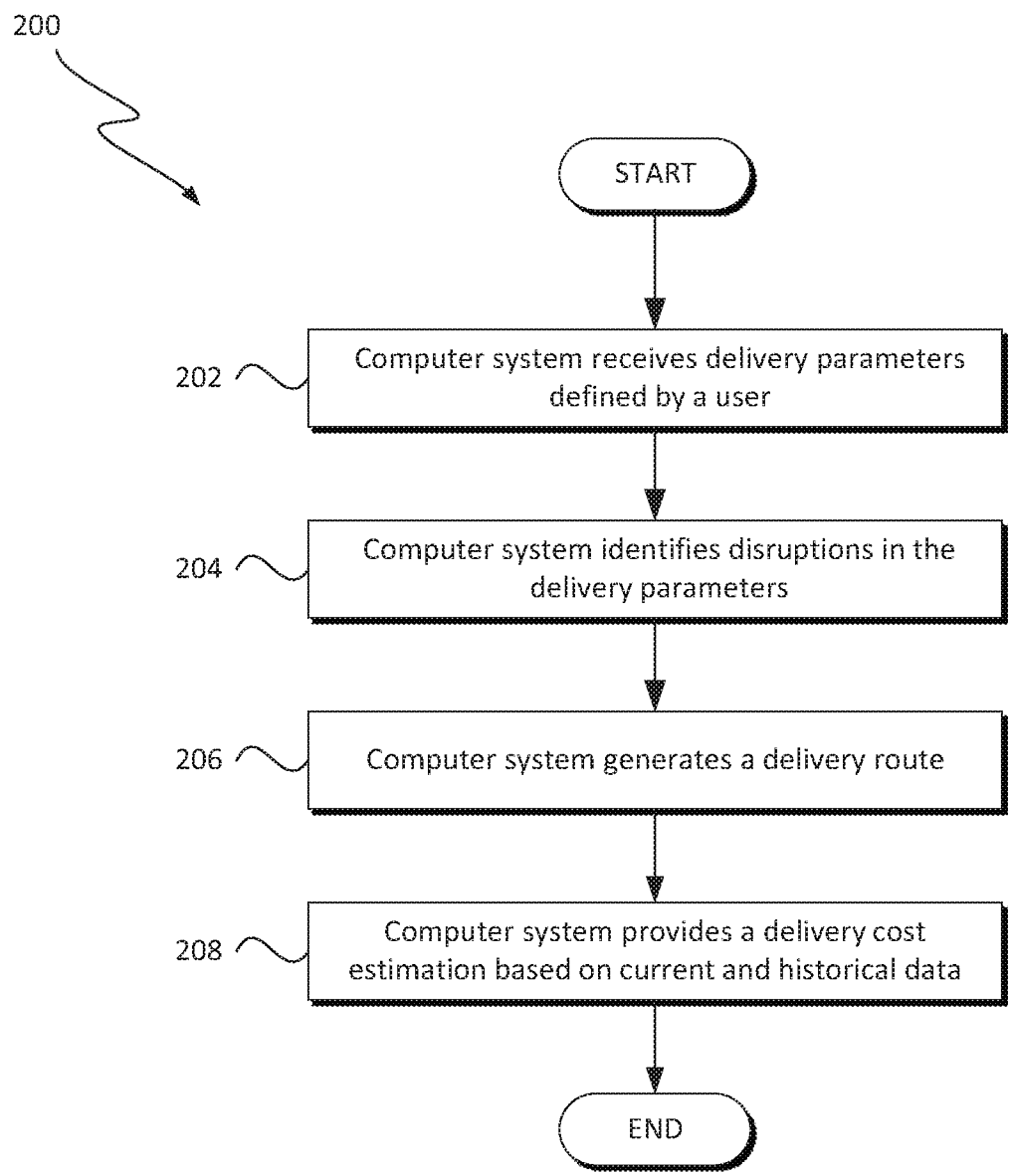
FIG. 2 illustrates operational processes of executing a system for a delivery route based on, at least, delivery parameters and a delivery cost estimation, on a computing device within the environment of FIG. 1, in accordance with an exemplary embodiment of the present invention.

FIG. 2 is a flowchart, 200, depicting operations of delivery prediction program 122 in computing environment 100, in accordance with an illustrative embodiment of the present invention. FIG. 2 also represents certain interactions between delivery prediction program 122 and client application 132. In some embodiments, the operations depicted in FIG. 2 incorporate the output of certain logical operations of delivery prediction program 122 executing on computer system 120. It should be appreciated that FIG. 2 provides an illustration of one implementation and does not imply any limitations with regard to the environments in which different embodiments may be implemented. Many modifications to the depicted environment may be made. In one embodiment, the series of operations in FIG. 2 can be performed in any order. In another embodiment, the series of operations, depicted in FIG. 2, can be terminated any operation. In addition to the features previously mentioned, any operations, depicted in FIG. 2, can be resumed at any time.

In operation 202, delivery prediction program 122 receives delivery parameters defined by a user. Embodiments of the present invention provide that the delivery parameters for delivery service of a product are associated with a delivery route request generated by a user of client device 130. In various embodiments, delivery prediction program 122 receives the delivery route request which includes delivery parameters including, but not limited to, (i) the delivery location and shipping location data, (ii) the delivery timelines and date of when the products need to be delivered to the delivery location, and (iii) the geographic regions for the delivery route.

In operation 204, delivery prediction program 122 identifies potential disruptions related to the delivery parameters. In various embodiments, delivery prediction program 122 identifies one or more environmental disruptions based on, at least, the delivery route request. In various embodiments, delivery prediction program 122 identifies environmental disruptions provided by the user of client device 130, where the user indicated, utilizing electronic pen 136, various disruptions between the delivery location and the shipping location (e.g., poor road conditions, flooded roads, slow speed zones, etc.). Additionally, in various embodiments, delivery prediction program 122 accesses database 144 and retrieves additional environmental disruptions from the corpus of knowledge stored on database 144.

In various embodiments, the corpus of knowledge stored on database 144 includes, but is not limited to, data submitted from various informational entities (e.g., meteorological entities, news-driven entities, governmental entities, etc.). In various embodiments, delivery prediction program 122 analyzes the corpus of knowledge and identifies one or more additional environmental disruptions associated with geographic region for the delivery route and the delivery location and shipping location. In various embodiments, delivery prediction program 122 plots (i) the user provided environmental disruptions, (ii) the one or more additional environmental disruptions, and (iii) the delivery location and the shipping location on a GUI or WUI the represents the geographic region of the delivery route.

In operation 206, delivery prediction program 122 generates a delivery route. In various embodiments, the delivery route is represented by a GUI or WUI that displays, for example, an illustration of the geographic region, the delivery and shipping location, the environmental disruptions, and the delivery route. In various embodiments, delivery prediction program 122 analyzes the locations of the environmental disruptions and the available roadways between the delivery location and the shipping location and delivery prediction program 122 generates a predicted delivery route. Embodiments of the present invention provide that delivery prediction program 122 analyzes the environmental disruptions to predict the fastest and most cost effective delivery route of a plurality of possible delivery routes. Additionally, embodiments of the present invention provide that delivery prediction program 122 accesses database 144 and retrieves historical traffic flow and historical environmental disruptions that have impacted delivery service in the past. Delivery prediction program 122 analyzes historical traffic flow and environmental disruptions and correlates this data with current traffic flow and environmental disruptions to predict a delivery route that reaches the delivery location within the delivery timeline and is cost effective. In various embodiments, delivery prediction program 122 generates a delivery route and plots the delivery route on the delivery route.

In operation 208, delivery prediction program 122 provides a delivery cost estimation based on current and historical data. In various embodiments, delivery prediction program 122 analyzes (i) the current and historical data and (ii) additional resources, and determines a cost-effective delivery route. In various embodiments, delivery prediction program 122 identifies additional resources within the geographic region (e.g., additional shipping companies). In various embodiments, delivery prediction program 122 identifies that for the delivery service of the product to be cost-effective within the geographic region the assistance of additional resources can be utilized to reduce the total cost of the delivery service. In various embodiments, delivery prediction program 122 incorporates the suggestion of additional resources into the delivery service of the product into the delivery route, where delivery prediction program 122 instructs the user of client device 130 to select a delivery route for delivery service. In various embodiments, delivery prediction program 122 generates a delivery cost estimation that illustrates the cost of the initial delivery route without the additional resources and the cost of the alternative delivery route that utilizes additional resources. Embodiments of the present invention provide that the additional resources may reduce the total time of the delivery service or may prolong the total time, however, the reduced total time may be more expensive and the prolonged total time may be cheaper in cost to deliver product. Additionally, embodiments of the present invention provide that the additional resources may be needed to transport product (e.g., the delivery service must cross a large body of water and the user of client device 130 does not have access to water transportation, the user of client device 130 only has access to small vehicles and needs to contract with a large transportation vehicle to ship the product across a long distance, etc.). In various embodiments, delivery prediction program 122 incorporates the delivery cost estimation into the delivery route and communicates the information to the user of client device 130. In various embodiments, delivery prediction program 122 includes program instructions instructing the user of client device 130 to review the information and either select confirm on the delivery route and cost or provide additional details, utilizing electronic pen 136, to modify the delivery route.

In various embodiments, if delivery prediction program 122 receives additional details from the user of client device 130 then delivery prediction program 122 analyzes the additional details and identifies the proposed changes. In various embodiments, delivery prediction program 122 identifies additional delivery parameters (e.g., environmental disruptions, reduced or increased budget for delivery, etc.). Delivery prediction program 122 incorporates the additional details and correlates the additional details with the initial information regarding the delivery route. Delivery prediction program 122 determines whether the delivery route can be updated based on, at least, the additional details. In various embodiments, delivery prediction program 122 determines that the delivery route cannot be updated and returns the original delivery route to the user of client device 130. In an alternative embodiment, delivery prediction program 122 determines that the delivery route can be updated and updates the delivery route which includes, but is not limited to, the delivery route and the cost associated with the delivery route. Delivery prediction program 122 communicates the updated delivery route to the user of client device 130. In various embodiments, delivery prediction program 122 monitors the direction the user is traveling in with regards to the generated delivery route.

In various embodiments, if delivery prediction program 122 identifies that the user changes directions and begins traveling in a direction different than provided by the delivery route delivery prediction program 122 analyzes the direction the user is currently traveling in and generates a second delivery route commensurate with the users current direction. In various embodiments, delivery prediction program 122 communicates the generated second delivery route to the user with program instructions instructing client application 132 to populate the second delivery route on client interface 134. Additionally, delivery prediction program 122 provides program instructions further instructing the user to follow the second delivery route to the delivery location.

Figure 3:
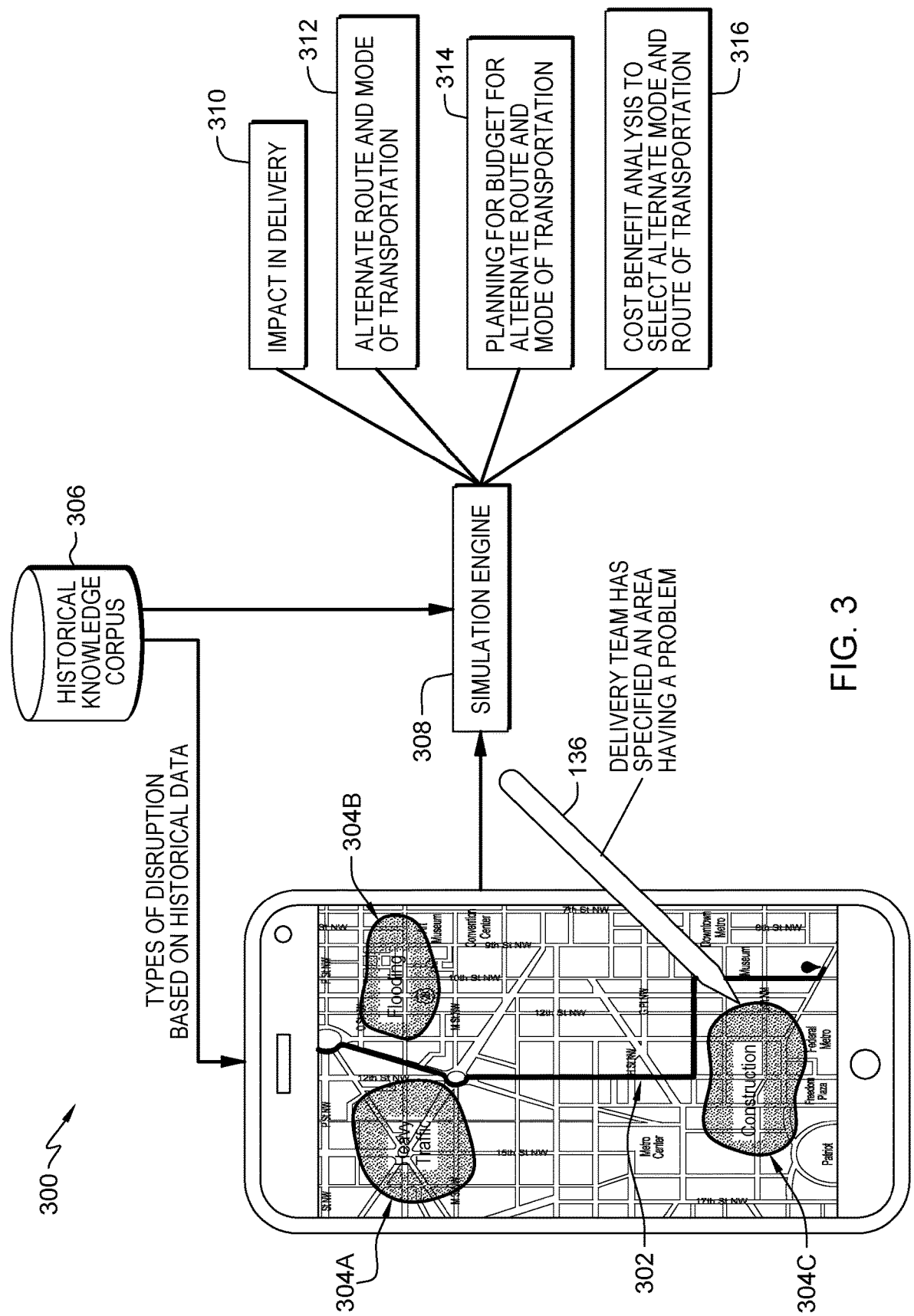
FIG. 3 depicts a block diagram of a delivery route according to at least an embodiment of the present invention.

FIG. 3 depicts block diagram which illustrates electronic pen 136 interacting with computer interface 134. FIG. 3 also illustrates delivery route 300 executing on a computing device. In various embodiments, FIG. 3 includes electronic pen 136, where a user of the computing device 130 can interact with the delivery route. In various embodiments, delivery route 300 includes directions 302, environmental disruptions 304A, 304B, and 304C. In this embodiment, directions 302 depicts the route in which delivery prediction program 122 determined was the fastest and most cost-effective route for delivery service. In this embodiment, environmental disruptions 304A, 304B, and 304C depict disruptions that would impede the delivery service if the delivery route went through these disruptions, delivery prediction program 122 identifies these disruptions and generate directions 302 that bypasses these disruptions.

As shown in FIG. 3, the user uses electronic pen 136 to interact with the delivery route by adding environmental disruptions 304A, 304B, and 304C, while delivery prediction program 122 (not shown) retrieves various types of disruption data from historical knowledge corpus 306. Then, information from the historical knowledge corpus 306 and the user's interactions are sent to simulation engine 308, which determines, for the delivery route: (i) an impact on delivery 310, (ii) an alternate route and mode of transportation 312, (iii) a budget impact for the alternate route and mode of transportation 314, and (iv) a cost benefit analysis for selecting the alternate route and mode of transportation 316.

In one example embodiment, a user generates a delivery route request and communicates the delivery route request to delivery prediction program 122. In this example embodiment, a user utilizes electronic pen 136 to designate, at least, a shipping location, a delivery location, the geographic region, and one or more environmental disruptions, by interacting with client interface 134 executing on client device 130. In this example embodiment, the delivery prediction program 122 identifies delivery parameters from the delivery route request that include, at least, (i) a shipping location of 1234 Friendly Ave, (ii) a delivery location of 1234 Exciting St., (iii) within geographic region State A, and (iv) at least one environmental disruption that represents flooding within a specified area within geographic region State A. In this example embodiment, delivery prediction program 122 accesses the corpus of knowledge stored on database 144, where delivery prediction program 122 retrieves data that includes, but is not limited to, various environmental disruptions, traffic reports, accident reports, and navigational maps associated with the geographic region of State A. In this example embodiment, the data retrieved from the corpus of knowledge is submitted from various information entities including, but not limited to, meteorological entities, news-driven entities, and governmental entities. In this example embodiment, delivery prediction program 122 identifies additional environmental disruptions that include, at least, construction and heavy traffic within the geographic region of State A. In this example embodiment, delivery prediction program 122 plots (i) the user provided environmental disruptions, (ii) the additional environmental disruptions (i.e., flooding, construction, and heavy traffic), (iii) the delivery location (i.e., 1234 Exciting St.), and (iv) and the shipping location (i.e., 1234 Friendly Ave.) on a GUI or WUI that represents the geographic region of the delivery route.

In this example embodiment, delivery prediction program 122 generates a delivery route. In various embodiments, the delivery route is represented by a GUI or WUI that displays, for example, an illustration of geographic region State A, 1234 Friendly Ave. and 1234 Exciting St., the identified environmental disruptions (i.e., flooding, construction, and heavy traffic), and the delivery route. Delivery prediction program 122 analyzes the locations of the environmental disruptions (i.e., flooding, construction, heavy traffic) and the available roadways between 1234 Friendly Ave. and 1234 Exciting St. and delivery prediction program 122 generates a predicted delivery route. Additionally, delivery prediction program 122 analyzes the environmental disruptions to predict the fastest and most cost effective delivery route of a plurality of possible delivery routes. This example embodiment provides that delivery prediction program 122 accesses database 144 and retrieves historical traffic flow and historical environmental disruptions that have impacted delivery service in the past. Additionally, delivery prediction program 122 analyzes historical traffic flow and environmental disruptions and correlates this data with current traffic flow and the current environmental disruptions to predict a delivery route that reaches 1234 Exciting St. within the delivery timeline and is cost effective. In this example embodiment, delivery prediction program 122 generates a delivery route based on, at least, the identified (i) shipping location, 1234 Friendly Ave., (ii) delivery location, 1234 Exciting St., (iii) current environmental disruptions (e.g., flooding, construction, heavy traffic), (iv) historical environmental disruptions (e.g., construction, heavy traffic), (v) current and historical traffic flow patterns, (vi) shipping timelines, and (vii) cost of shipping the product, where delivery prediction program 122 plots the delivery route. This example embodiment provides that the delivery route is, at least, a fast and cost effective delivery route of a plurality of delivery route that avoids the environmental disruptions and delivers the product within the specified shipping parameters (e.g., shipping timeline, cost of shipping, etc.).

In this example embodiment, delivery prediction program 122 analyzes (i) the current and historical data and identifies additional resources (e.g., additional shipping companies), and determines a cost-effective delivery route. In this example embodiment, delivery prediction program 122 identifies that for the delivery service of the product to be cost-effective within geographic region State A the assistance of additional resources can be utilized to reduce the total cost of the delivery service. In this example embodiment, delivery prediction program 122 incorporates the suggestion of additional resources into the delivery service of the product for the delivery route, where delivery prediction program 122 instructs the user of client device 130 to select an alternative delivery route for delivery service that includes additional shipping company A. In this example embodiment, delivery prediction program 122 generates a delivery cost estimation that illustrates the cost of the initial delivery route without the use of additional shipping company A and the cost of the alternative delivery route that utilizes shipping company A. This example embodiment provides that additional shipping company A reduces the total time of the delivery service, however, the reduced total time is more expensive. Additionally, this example provides that additional shipping company A allows the delivery route to cross over a large body of water, as opposed to shipping around the large body of water and crossing a bridge. Delivery prediction program 122 communicates program instructions instructing the user of client device 130 to review the information of the additional delivery route that includes shipping company A and further instructs the user to select "confirm" on the delivery route and cost or provide additional details, utilizing electronic pen 136, to modify the delivery route.

In a second example, a user generates a delivery route request and communicates the delivery route request to delivery prediction program 122. In this second example embodiment, a user utilizes electronic pen 136 to designate, at least, a shipping location (i.e., 1234 Snowy Dr.), a delivery location (1234 Cloudy Ave.), the geographic region City C, and one or more environmental disruptions (i.e., construction zone and heavy traffic zone located within the downtown area of the geographic region of City C), by interacting with client interface 134 executing on client device 130. Additionally, the user utilizing electronic pen 136 sets the time to delivery to two (2) hours from 1234 Snowy Dr. to 1234 Cloudy Ave and that there is a six-hundred dollar U.S. ($600) budget for delivery. In this example embodiment, a user utilizing electronic pen 136 drops a in on client interface 134 marking the positions of 1234 Snowy Dr. and 1234 Cloudy Ave., and utilizing electronic pen 136 the user draws a rectangular shape on client interface 134 (i.e., a pictographic digital image of a map being displayed to the user) to indicate the boundaries of the geographic region City C, and utilizing electronic pen 136 the user draws two (2) irregular shape within the boundaries of the geographic region City C and selects from a dropdown menu that the first irregular shape is an environmental disruption indicating a construction zone and a the second irregular shape is an environmental disruption indicating heavy traffic zone located within the downtown area of the geographic region of City C. In this second example embodiment, the delivery prediction program 122 identifies delivery parameters from the delivery route request that include, at least, (i) the shipping location, (ii) the delivery location, (iii) the boundaries of the geographic region of City C, and the environmental disruptions within the geographic region City C. In this example embodiment, delivery prediction program 122 accesses the corpus of knowledge stored on database 144, where delivery prediction program 122 retrieves data that includes, but is not limited to, various environmental disruptions, traffic reports, accident reports, and navigational maps associated with the geographic region City C. In this second example embodiment, the data retrieved from the corpus of knowledge is submitted from various information entities including, but not limited to, meteorological entities, news-driven entities, and governmental entities. In this second example embodiment, delivery prediction program 122 identifies additional environmental disruptions that include, at least, heavy snowfall within the geographic region City C, and one or more traffic accidents within geographic region City C. In this second example embodiment, delivery prediction program 122 identifies that the heavy snowfall indicates slippery road conditions and that traffic will progress at slower speeds based on, at least, the heavy snowfall. Additionally, traffic will progress at slower speeds based on, at least, the currently identified traffic accidents and that the heavy snowfall indicates that additional traffic accidents are expected based on historical data regarding heavy snowfall. The present embodiment provides that during periods of heavy snowfall that the amount of traffic accidents increases by a threshold value of thirty-six percent (36%). In this second example embodiment, delivery prediction program 122 plots (i) the user provided environmental disruptions (i.e., construction and heavy traffic within the downtown area), (ii) the additional identified environmental disruptions from the corpus of knowledge, (iii) the delivery location (i.e., 1234 Cloudy Ave), and (iv) the shipping location (i.e., 1234 Snowy Dr.) on a GUI or WUI that represents the delivery route.

In this second example embodiment, delivery prediction program 122 generates a delivery route. The delivery route represents a GUI or WUI that displays, for example, an illustration of geographic region City C, 1234 Cloudy Ave., 1234 Snowy Dr., the identified and user-provided environmental disruptions (i.e., construction, heavy traffic in the downtown area, heavy snow, traffic accidents). Delivery prediction program 122 analyzes the locations of the environmental disruptions and the available roadways between 1234 Snowy Dr. and 1234 Cloudy Ave. and delivery prediction program 122 generates a predicted turn-by-turn directions for the delivery route. Additionally, delivery prediction program 122 analyzes the environmental disruptions to predict the fastest and most cost effective delivery route out of a plurality of possible delivery routes. This example embodiment provides that delivery prediction program 122 accesses database 144 and retrieves historical traffic flow data and historical environmental disruption data that has impacted delivery service in the past. Additionally, delivery prediction program 122 analyzes historical traffic flow and environmental disruptions and correlates this data with current traffic flow, current traffic accidents, and current environmental disruptions to predict a delivery route that reaches 1234 Cloudy Ave. from 1234 Snowy Dr. within the delivery timeline and is cost effective.

In this second example embodiment, delivery prediction program 122 analyzes (i) the current and historical data and identifies additional resources (e.g., additional and/or alternative shipping companies), and determines a cost-effective delivery route. In this second example embodiment, delivery prediction program 122 identifies that for the delivery service of the product to be cost-effective within geographic region City C the assistance of a local (i.e., shipping company within geographic region City C) shipping company needs to be utilized because it would be cost effective to ship the products in a large fifty-four foot (54') semi-trailer truck as opposed to the user's small van-size vehicles to prevent any destruction of property and ensure the vehicle does not succumb to the slippery roads caused by the heavy snowfall. In this second example embodiment, delivery prediction program 122 provides two delivery routes for the user to select. In the first delivery route, delivery prediction program 122 provides the user with a delivery route that directs the driver from 1234 Snowy Dr. to 1234 Cloudy Ave. incorporates directions that include, but not limited to, avoiding the downtown area, avoiding the major highways (i.e., avoiding areas that historically have high traffic accident rates during heavy snowfall because of the higher speeds drivers travel at), and avoids the identified and user-provided environmental disruptions. Additionally, in the first delivery route, it would take the driver an estimated fifty-five minutes to arrive at 1234 Cloudy Ave. at a cost of two-hundred and fifty U.S. dollars.

In the second example embodiment, delivery prediction program 122 provides the user with a second delivery route that instructs the user to select the additional local shipping company to deliver the product from 1234 Snowy Dr. to 1234 Cloudy Ave, where the additional local shipping company arrives and loads the product and transports the product on the delivery route, where the delivery route avoids the downtown area, avoids the major highways, and avoids the identified and user-provided environmental disruptions. The second delivery route is estimated to take one hour and forty-five minutes to travel between 1234 Snowy dr. and 1234 Cloudy Ave. and is estimated to cost four-hundred and sixty U.S. dollars because of the increased size of the semi-trailer truck and that it would require more time to travel than the user's small van-like vehicles, however, the larger truck allows for the product to be shipped safely to the delivery location because the semi-trailer truck if involved in an accident is less likely to damage the product. In this example embodiment, delivery prediction program 122 provides a set of program instructions instructing the user to select either the first delivery route, the second delivery route, and/or recreate a third delivery route for shipping the product. In this second example embodiment, the user selects the second delivery route and delivery prediction program 122 communicates with the additional delivery company and communicates the delivery route and the time the product should be loaded and transported to 1234 Cloudy Ave.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 4:
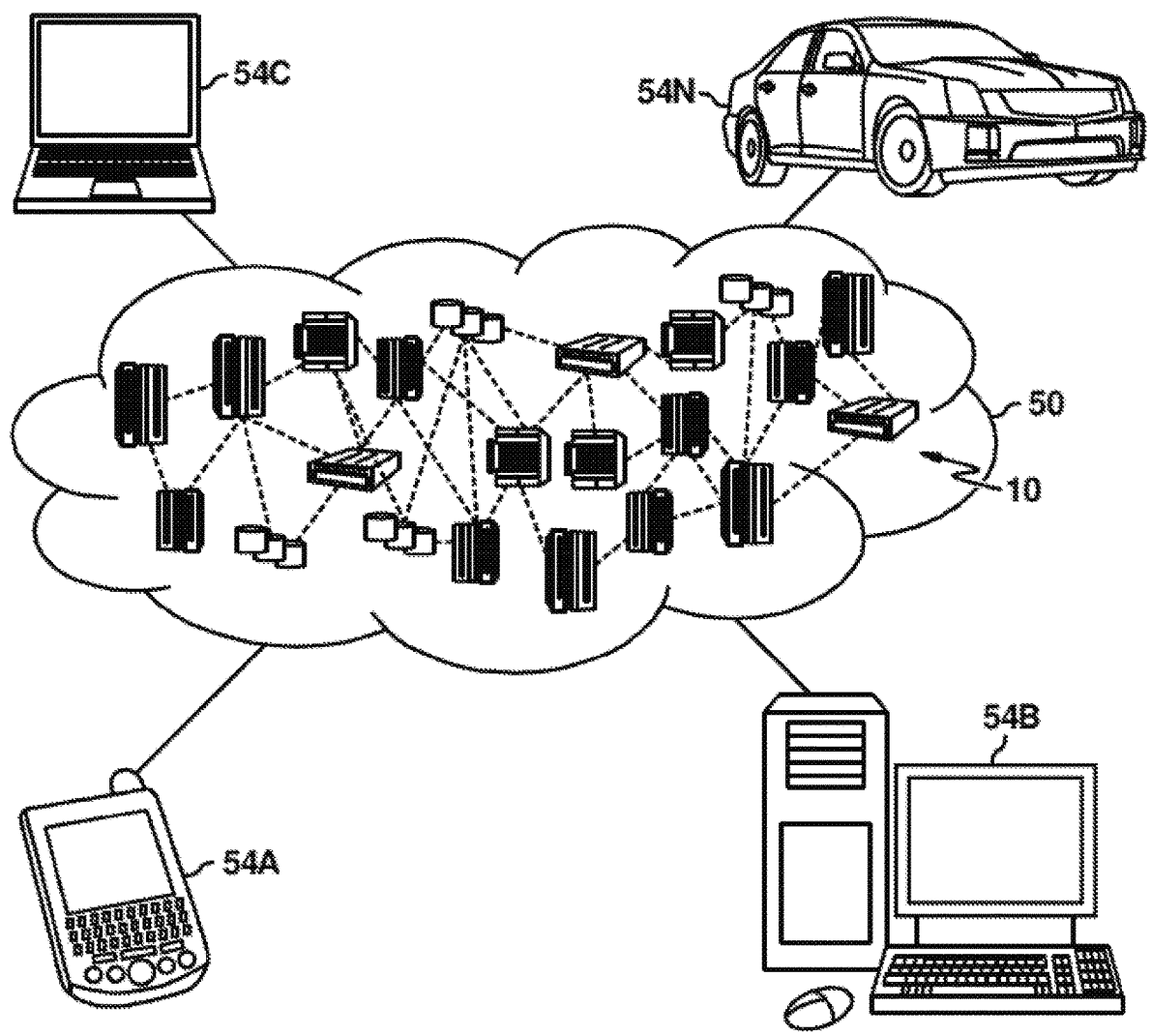
FIG. 4 depicts a cloud computing environment according to at least one embodiment of the present invention.

Referring now to FIG. 4, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C, and/or automobile computer system 54N may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-N shown in FIG. 4 are intended to be illustrative only and that computing nodes 10 and cloud computing environment 50 can communicate with any type of computerized device over any type of network and/or network addressable connection (e.g., using a web browser).

Figure 5:
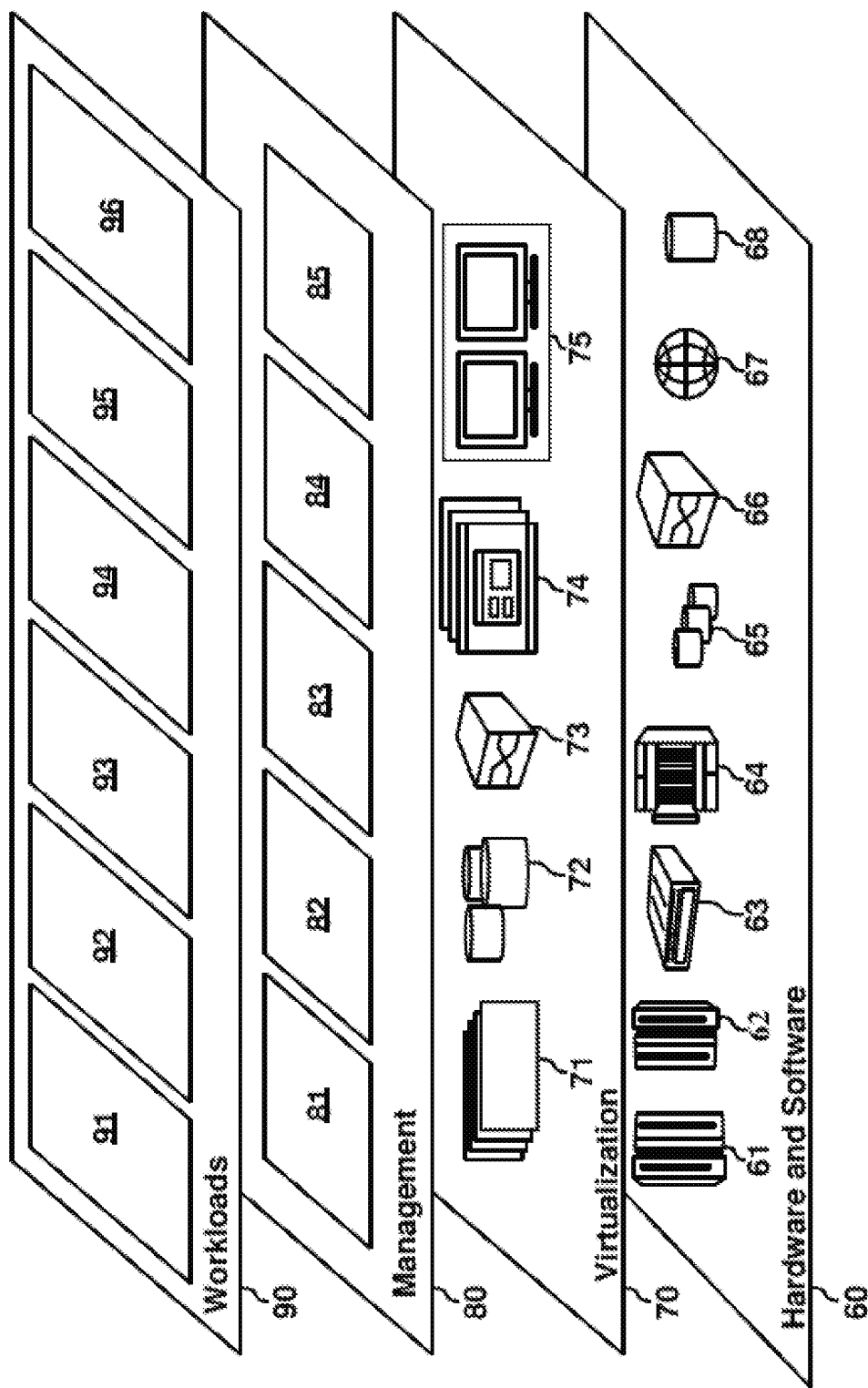
FIG. 5 depicts abstraction model layers according to at least on embodiment of the present invention.

Referring now to FIG. 5, a set of functional abstraction layers provided by cloud computing environment 50 (FIG. 4) is shown. It should be understood in advance that the components, layers, and functions shown in FIG. 5 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and providing soothing output 96.

Figure 6:
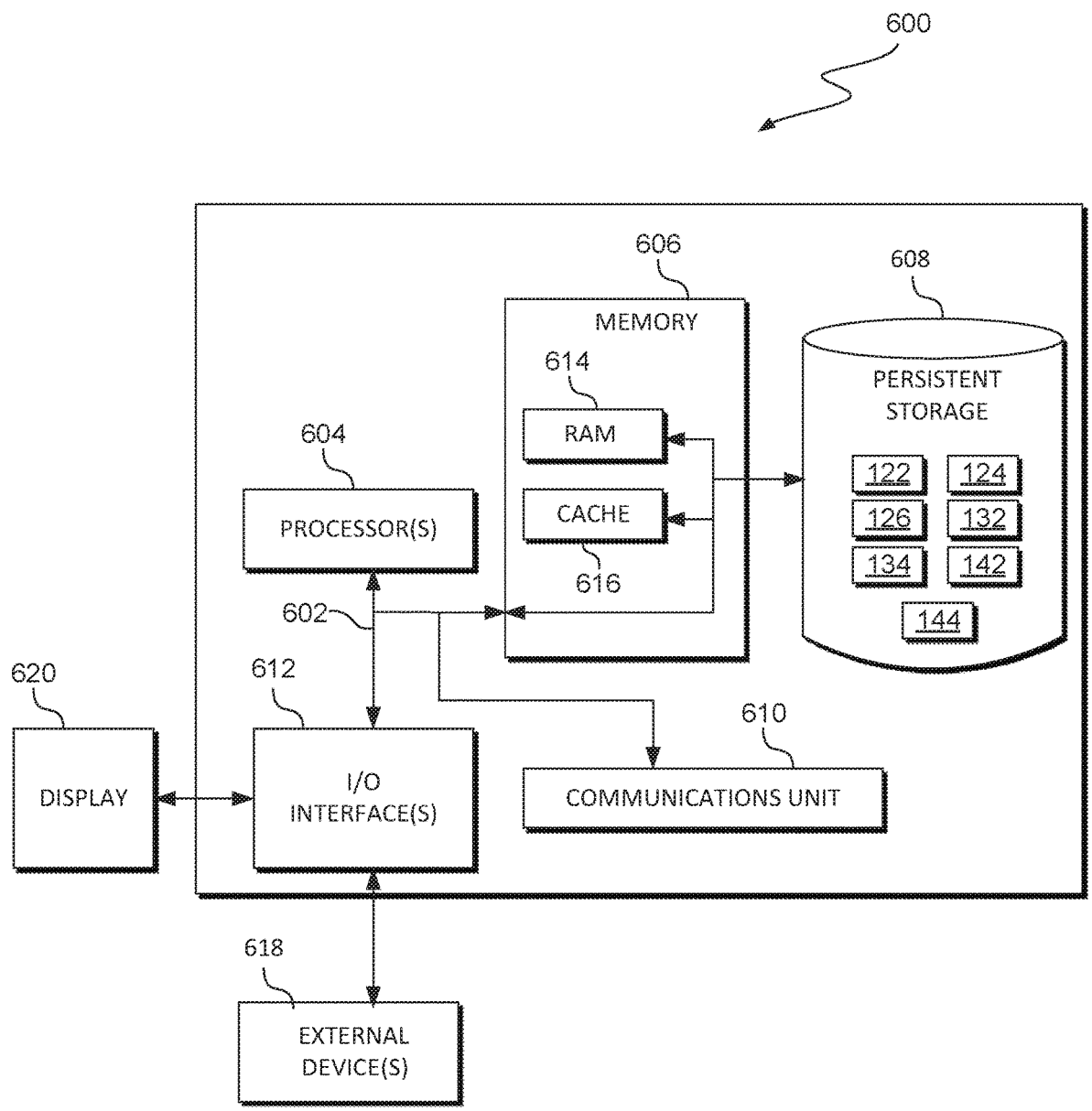
FIG. 6 depicts a block diagram of components of one or more computing devices within the computing environment depicted in FIG. 1, in accordance with an exemplary embodiment of the present invention.

FIG. 6 depicts a block diagram, 600, of components of computer system 120, client device 130, and storage area network (SAN) 140, in accordance with an illustrative embodiment of the present invention. It should be appreciated that FIG. 6 provides only an illustration of one implementation and does not imply any limitations with regard to the environments in which different embodiments may be implemented. Many modifications to the depicted environment may be made.

Computer system 120, client device 130, and storage area network (SAN) 140 includes communications fabric 602, which provides communications between computer processor(s) 604, memory 606, persistent storage 608, communications unit 610, and input/output (I/O) interface(s) 612. Communications fabric 602 can be implemented with any architecture designed for passing data and/or control information between processors (such as microprocessors, communications and network processors, etc.), system memory, peripheral devices, and any other hardware components within a system. For example, communications fabric 602 can be implemented with one or more buses.

Memory 606 and persistent storage 608 are computer-readable storage media. In this embodiment, memory 606 includes random access memory (RAM) 614 and cache memory 616. In general, memory 606 can include any suitable volatile or non-volatile computer-readable storage media.

Delivery prediction program 122, computer interface 124, client application 132, client interface 134, electronic pen 136, server application 142, and database 144. are stored in persistent storage 608 for execution and/or access by one or more of the respective computer processors 604 via one or more memories of memory 606. In this embodiment, persistent storage 608 includes a magnetic hard disk drive. Alternatively, or in addition to a magnetic hard disk drive, persistent storage 608 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 608 may also be removable. For example, a removable hard drive may be used for persistent storage 608. Other examples include optical and magnetic disks, thumb drives, and smart cards that are inserted into a drive for transfer onto another computer-readable storage medium that is also part of persistent storage 608.

Communications unit 610, in these examples, provides for communications with other data processing systems or devices, including resources of network 110. In these examples, communications unit 610 includes one or more network interface cards. Communications unit 610 may provide communications through the use of either or both physical and wireless communications links. Delivery prediction program 122, computer interface 124, client application 132, client interface 134, electronic pen 136, server application 142, and database 144 may be downloaded to persistent storage 608 through communications unit 610.

I/O interface(s) 612 allows for input and output of data with other devices that may be connected to computer system 120, client device 130, and SAN 140. For example, I/O interface 612 may provide a connection to external devices 618 such as a keyboard, keypad, a touch screen, and/or some other suitable input device. External devices 618 can also include portable computer-readable storage media such as, for example, thumb drives, portable optical or magnetic disks, and memory cards. Software and data used to practice embodiments of the present invention, e.g., delivery prediction program 122, computer interface 124, client application 132, client interface 134, electronic pen 136, server application 142, and database 144, can be stored on such portable computer-readable storage media and can be loaded onto persistent storage 608 via I/O interface(s) 612. I/O interface(s) 612 also connect to a display 620.

Display 620 provides a mechanism to display data to a user and may be, for example, a computer monitor, or a television screen.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

It is to be noted that the term(s) such as, for example, "Smalltalk" and the like may be subject to trademark rights in various jurisdictions throughout the world and are used here only in reference to the products or services properly denominated by the marks to the extent that such trademark rights may exist.

What is claimed is:

1. A computer-implemented method, the method comprising:
  receiving, by one or more processors, a delivery route request;
  identifying, by the one or more processors, delivery parameters within the request for a delivery, wherein the delivery parameters include (i) a delivery route from a shipping location to a delivery location, and (ii) one or more delivery constraints;
  utilizing, by the one or more processor, the delivery parameters within the request to generate a delivery route simulation of the impact on a delivery service by;
  analyzing current traffic flow, historical traffic flow, and environmental disruptions to define a threshold value of criticality of impact to the delivery service;
  utilizing the delivery parameters to predict a degree of impact on the delivery service;
  displaying, by the one or more processors, a generated revised delivery route using the one or more processors, based on the delivery route simulation, on a digital map via a graphical user interface (GUI), wherein the GUI is configured to be interacted with by one or more users;
  receiving, by the one or more processors, from a user via the GUI, a definition of an environmental disruption, wherein the definition includes a type of the environmental disruption selected by the user using the GUI;
  receiving, by one or more processors, digital data from the GUI, a geographic region for the delivery route that includes the delivery location and the shipping location defined by an input device interacting with the GUI, and the input device captures handwriting, brush strokes, and user movements electronically and converts the analog hand motions into the digital data received by the one or more processors from the GUI, and the digital data defines one or more boundaries by drawing a shape using the input device on a pictographic image representing the geographic region;

adding, by the one or more processors, the environmental disruption to the digital map;

generating, by the one or more processors, another revised delivery route, wherein the another revised delivery route modifies the revised delivery route to avoid the environmental disruption while satisfying the one or more delivery constraints; and displaying, by the one or more processors, the another revised delivery route on the digital map via the GUI.

2. The computer-implemented method of claim 1, the method further comprising:

instructing, by one or more processors, the user to define the environmental disruption by using the GUI to draw a shape on the digital map.

3. The computer-implemented method of claim 1, the method further comprising:

communicating, by one or more processors, with a corpus of knowledge that represents a collection of data from informational entities relating to an area surrounding the delivery route; and determining, by one or more processors, an additional environmental disruption based, at least in part, on communicating with the corpus of knowledge;

wherein the revised delivery route further modifies the delivery route to avoid the determined additional environmental disruption.

4. The computer-implemented method of claim 3, wherein the determined additional environmental disruption is a traffic disruption.

5. The computer-implemented method of claim 1, wherein the revised delivery route utilizes a different mode of transportation than the delivery route.

6. The computer-implemented method of claim 1, wherein the one or more delivery constraints include a budget constraint and a time constraint.

7. The computer-implemented method of claim 6, wherein satisfying the one or more delivery constraints includes performing a cost-benefit analysis that minimizes a delivery cost or a delivery time.

8. A computer program product comprising:

one or more computer-readable storage media and program instructions stored on the one or more computer-readable storage media, the stored program instructions comprising:

program instruction to receive a delivery route request;

program instructions to identify delivery parameters for a delivery, wherein the delivery parameters include (i) a delivery route from a shipping location to a delivery location, and (ii) one or more delivery constraints;

program instruction to utilize the delivery parameters within the request to generate a delivery route simulation of the impact on a delivery service by;

analyzing current traffic flow, historical traffic flow, and environmental disruptions to define a threshold value of criticality of impact to the delivery service;

utilizing the delivery parameters to predict a degree of impact on the delivery service;

program instructions to display a generated revised delivery route based on the delivery simulation, on a digital map via a graphical user interface (GUI), wherein the GUI is configured to be interacted with by one or more users;

program instructions to receive from a user via the GUI, a definition of an environmental disruption, wherein the definition includes a type of the environmental disruption selected by the user using the GUI;

receiving, by one or more processors, digital data from the GUI, a geographic region for the delivery route that includes the delivery location and the shipping location defined by an input device interacting with the GUI, and the input device captures handwriting, brush strokes, and user movements electronically and converts the analog hand motions into the digital data received by the one or more processors from the GUI and the digital data defines one or more boundaries by drawing a shape using the input device on a pictographic image representing the geographic region;

program instructions to add the environmental disruption to the digital map;

program instructions to generate another revised delivery route, wherein the another revised delivery route modifies the revised delivery route to avoid the environmental disruption while satisfying the one or more delivery constraints; and program instructions to display the another revised delivery route on the digital map via the GUI.

9. The computer program product of claim 8, the stored program instructions further comprising:

program instructions to instruct the user to define the environmental disruption by using the GUI to draw a shape on the digital map.

10. The computer program product of claim 8, the stored program instructions further comprising:

program instructions to communicate with a corpus of knowledge that represents a collection of data from informational entities relating to an area surrounding the delivery route; and program instructions to determine an additional environmental disruption based, at least in part, on communicating with the corpus of knowledge;

wherein the revised delivery route further modifies the delivery route to avoid the determined additional environmental disruption.

11. The computer program product of claim 10, wherein the determined additional environmental disruptions is a traffic disruption.

12. The computer program product of claim 8, wherein the revised delivery route utilizes a different mode of transportation than the delivery route.

13. The computer program product of claim 8, wherein the one or more delivery constraints include a budget constraint and a time constraint.

14. The computer program product of claim 13, wherein satisfying the one or more delivery constraints includes performing a cost-benefit analysis that minimizes a delivery cost or a delivery time.

15. A computer system, the computer system comprising:

one or more computer processors;

one or more computer readable storage medium; and program instructions stored on the computer readable storage medium for execution by at least one of the one or more processors, the stored program instructions comprising:
program instructions to receive a delivery route request;
program instructions to identify delivery parameters for a delivery, wherein the delivery parameters include (i) a delivery route from a shipping location to a delivery location, and (ii) one or more delivery constraints;
program instructions to utilize the delivery parameters within the request to generate a delivery route simulation of the impact on a delivery service by;
analyzing current traffic flow, historical traffic flow, and environmental disruptions to define a threshold value of criticality of impact to the delivery service;
utilizing the delivery parameters to predict a degree of impact on the delivery service;
program instructions to display a generated revised delivery route using the one or more processors, based on the delivery route simulation, delivery route on a digital map via a graphical user interface (GUI), wherein the GUI is configured to be interacted with by one or more users;
program instructions to receive from a user via the GUI, a definition of an environmental disruption, wherein the definition includes a type of the environmental disruption selected by the user using the GUI;
receiving, by one or more processors, digital data from the GUI, a geographic region for the delivery route that includes the delivery location and the shipping location defined by an input device interacting with the GUI, and the input device captures handwriting, brush strokes, and user movements electronically and converts the analog hand motions into the digital data received by the one or more processors from the GUI and the digital data defines one or more boundaries by drawing a shape using the input device on a pictographic image representing the geographic region;
program instructions to add the environmental disruption to the digital map;
program instructions to generate another revised delivery route, wherein the another revised delivery route modifies the revised delivery route to avoid the environmental disruption while satisfying the one or more delivery constraints; and
program instructions to display the another revised delivery route on the digital map via the GUI.

16. The computer system of claim 15, the stored program instructions further comprising:
program instructions to instruct the user to define the environmental disruption by using the GUI to draw a shape on the digital map.

17. The computer system of claim 15, the stored program instructions further comprising:
program instructions to communicate with a corpus of knowledge that represents a collection of data from informational entities relating to an area surrounding the delivery route; and
program instructions to determine an additional environmental disruption based, at least in part, on communicating with the corpus of knowledge;
wherein the revised delivery route further modifies the delivery route to avoid the determined additional environmental disruption.

18. The computer system of claim 17, wherein the determined additional environmental disruptions is a traffic disruption.

19. The computer system of claim 15, wherein the revised delivery route utilizes a different mode of transportation than the delivery route.

20. The computer system of claim 15, wherein the one or more delivery constraints include a budget constraint and a time constraint.

* * * * *